(12) United States Patent
Cao et al.

(10) Patent No.: US 9,607,952 B1
(45) Date of Patent: Mar. 28, 2017

(54) HIGH-Z OXIDE NANOPARTICLES EMBEDDED IN SEMICONDUCTOR PACKAGE

(71) Applicant: International Business Machines Corporation, Armonk, NY (US)

(72) Inventors: Qing Cao, Yorktown Heights, NY (US); Ying He, Yorktown Heights, NY (US); Jeehwan Kim, Cambridge, MA (US); Ning Li, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/928,425

(22) Filed: Oct. 30, 2015

(51) Int. Cl.
| | |
|---|---|
| *H01L 21/00* | (2006.01) |
| *H01L 23/00* | (2006.01) |
| *H01L 23/29* | (2006.01) |
| *H01L 23/31* | (2006.01) |
| *H01L 21/56* | (2006.01) |

(52) U.S. Cl.
CPC .......... *H01L 23/573* (2013.01); *H01L 21/565* (2013.01); *H01L 23/295* (2013.01); *H01L 23/3114* (2013.01)

(58) Field of Classification Search
CPC ....... H01L 2924/0002; H01L 2924/053; H01L 23/52; H01L 23/295
See application file for complete search history.

(56) References Cited

U.S. PATENT DOCUMENTS

| | | | |
|---|---|---|---|
| 5,952,600 A | 9/1999 | Herr | |
| 6,909,159 B2 | 6/2005 | Friend et al. | |
| 7,880,340 B2 | 2/2011 | Miller | |
| 8,352,752 B2 | 1/2013 | Croguennec et al. | |
| 8,896,978 B2 | 11/2014 | Baumann | |
| 8,954,806 B2 | 2/2015 | Dan et al. | |
| 9,058,903 B2 | 6/2015 | Arsovski et al. | |
| 2008/0093728 A1* | 4/2008 | Mahler | ................... H01L 21/56 257/701 |
| 2008/0246046 A1* | 10/2008 | Chik | ...................... H05B 33/22 257/98 |
| 2009/0128023 A1* | 5/2009 | Kwak | ................. H01L 27/3246 313/504 |
| 2011/0049684 A1* | 3/2011 | Lee | ........................ H01L 23/295 257/659 |

(Continued)

FOREIGN PATENT DOCUMENTS

| | | |
|---|---|---|
| EP | 2194488 A1 | 6/2010 |
| FR | 2793973 B1 | 2/2007 |

(Continued)

OTHER PUBLICATIONS

English translation for Application No. WO2015007847A1.

(Continued)

*Primary Examiner* — A. Sefer
(74) *Attorney, Agent, or Firm* — Louis J. Percello; Ryan, Mason & Lewis, LLP

(57) ABSTRACT

A method includes embedding high-z oxide nanoparticles in a semiconductor package of a semiconductor packaged assembly, wherein the high-z nanoparticles are operative to emit electron radiation when exposed to a radiation source to render a semiconductor device in the semiconductor package inoperable.

20 Claims, 1 Drawing Sheet

(56) References Cited

U.S. PATENT DOCUMENTS

| | | | |
|---|---|---|---|
| 2011/0233655 A1* | 9/2011 | Shimizu | B82Y 10/00 |
| | | | 257/325 |
| 2013/0140649 A1 | 6/2013 | Rogers et al. | |
| 2014/0335015 A1* | 11/2014 | Pottier | A61K 33/24 |
| | | | 424/1.29 |
| 2015/0192637 A1 | 7/2015 | Falk et al. | |
| 2016/0136304 A1* | 5/2016 | Poul | A61K 9/0024 |
| | | | 424/9.42 |
| 2016/0139476 A1* | 5/2016 | Garcia | G02F 1/0123 |
| | | | 359/275 |

FOREIGN PATENT DOCUMENTS

| | | |
|---|---|---|
| KR | 101198212 B1 | 11/2012 |
| WO | 2015007847 A1 | 1/2015 |

OTHER PUBLICATIONS

English translation for Korean Application No. KR101198212B1.
English translation for European Application No. EP2194488A1.
English translation for France Application No. FR2793973B1.

* cited by examiner

HIGH-Z OXIDE NANOPARTICLES EMBEDDED IN SEMICONDUCTOR PACKAGE

BACKGROUND

Preventing unauthorized use of semiconductor chips (integrated circuit devices or semiconductor devices) is critical to meeting certain types of government regulations. By way of example, some chips can be used for both commercial and military applications. It is understood that chips built for military applications are required to adhere to more stringent operational standards (military standards) than chips built for commercial applications. As a result, chips that are built for both commercial and military applications may not satisfy all necessary military standards. Thus, government regulations may require that such dual application chips only be sold for commercial use, and therefore military use, such as using the dual application chips in environments that require radiation hardening, is prohibited.

SUMMARY

Embodiments provide techniques for embedding high-z oxide nanoparticles in a semiconductor package. Such methods, for example, prevent unauthorized use of semiconductor chips in environments requiring radiation hardening.

For example, in one embodiment, a method comprises embedding high-z oxide nanoparticles in a semiconductor package of a semiconductor packaged assembly, wherein the high-z nanoparticles are operative to emit electron radiation when exposed to a radiation source to render a semiconductor device in the semiconductor package inoperable.

Advantageously, embedding high-z oxide nanoparticles in a semiconductor package in accordance with embodiments of the invention creates a semiconductor packaged assembly that is self-destructive when exposed to radiation. Therefore, for example, when performing reliability testing of chips intended for use in military applications by exposing the chips under test to radiation, chips that are not fully compliant with military standards (e.g., dual application chips, as mentioned above) but are formed with embedded high-z oxide nanoparticles will be destroyed and thus prevented from being used in military environments.

DETAILED DESCRIPTION

Embodiments will now be described in further detail with regard to techniques for preventing the unauthorized use of semiconductor chips in environments requiring radiation hardening. It is to be understood that various layers, structures, and/or regions shown in the accompanying drawings are schematic illustrations that are not necessarily drawn to scale. In addition, for ease of explanation, one or more layers, structures, and regions of a type commonly used to form semiconductor devices or structures may not be explicitly shown in a given drawing. This does not imply that any of the layers, structures, and regions not explicitly shown are omitted from the actual devices.

According to embodiments of the invention, a method of preventing the unauthorized use of semiconductor chips in environments requiring radiation hardening is to have the chips self-destruct (i.e., be rendered fully or substantially inoperable) when they are exposed to radiation.

Figure 1A:
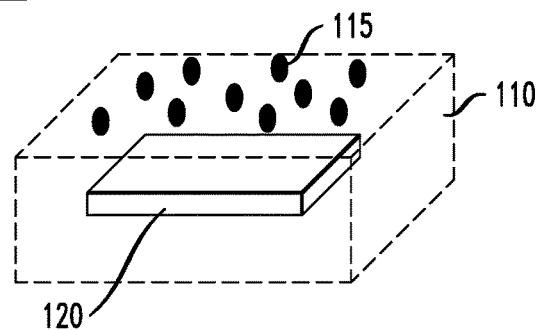
FIG. 1A illustrates a semiconductor die encapsulated into an integrated circuit package containing high-z oxide nanoparticles, according to an embodiment of the invention.

FIG. 1A illustrates a semiconductor packaged assembly 100 comprising semiconductor chip 120 encapsulated into semiconductor package 110. Assume that semiconductor packaged assembly 100 contains a semiconductor chip (or chips) that is intended to be sold only for commercial use (regardless if it could also be used for some less stringent military applications). That is, assume government regulations have prohibited the use of semiconductor packaged assembly 100 in applications, for example military applications, requiring a radiation hardened environment. In order to prevent the unauthorized use of semiconductor packaged assembly 100 in a radiation hardened environment, semiconductor packaged assembly 100 is designed to enhance the destruction of semiconductor chip 120 when exposed to radiation.

As illustrated in FIG. 1A, in accordance with embodiments of the invention, high-z oxide nanoparticles 115 are embedded into semiconductor package 110. In one example, semiconductor packing 110 comprises a polymer packaging. The high-z oxide nanoparticles 115 may comprise, for example, hafnium oxide (also known as hafnia) or $HfO_2$. High-z material refers to material comprising an element with a high atomic number (z) such as, by way of example but not limited to, hafnium.

Integrated circuits exposed to radiation can fail to operate properly. However, there exist radiation environments wherein the level of radiation in the environment is not sufficient to fully or substantially render the semiconductor chip inoperable (i.e., destroy the semiconductor chip). As such, the high-z oxide nanoparticles 115 embedded into semiconductor package 110 are operative to enhance the radiation level received by semiconductor chip 120 such that semiconductor chip 120 is permanently destroyed. While not limited thereto, this technique is particularly well-suited for silicon-on-insulator (SOI) substrate-based semiconductor chips, and destruction of complementary metal oxide semiconductor (CMOS) circuit devices formed therein.

Figure 1B:
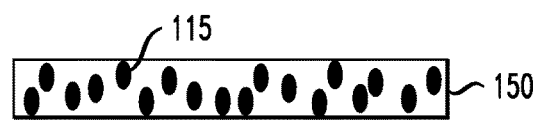
FIG. 1B illustrates a layer containing high-z oxide nanoparticles, according to an embodiment of the invention.

In one embodiment, as illustrated in FIG. 1B, the high-z oxide nanoparticles are embedded in the semiconductor package by forming a layer 150 with high-z oxide nanoparticles 115 contained therein on and/or in the semiconductor package 110. In one example, layer 150 can be in the form of a film deposited or otherwise formed on and/or in the semiconductor packaging. The film can be on the order of microns to millimeters in thickness depending on the size of the semiconductor packaging. The film layer 150 can be formed around the entire periphery (i.e., all sides) of the semiconductor package 110 or on less than the entire periphery. In one embodiment, the $HfO_2$ nanoparticles 115 are first suspended in an aqueous or organic solvent, and then deposited on top of the semiconductor package 110 by techniques such as, for example, spin coating, spray coating, or doctor blading. These techniques form the film layer 150 with the $HfO_2$ nanoparticles 115 contained therein.

Figure 2:
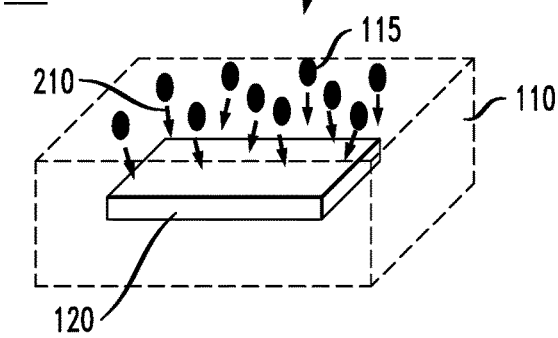
FIG. 2 illustrates the integrated circuit package of FIG. 1 exposed to radiation, according to a methodology of an embodiment of the invention.

As shown in FIG. 2, semiconductor packaged assembly 100 receives radiation 205 from a source of radiation (not expressly shown). The radiation can be introduced from a source in a testing environment or in a target radiation hardened environment. In one example, radiation 205 comprises gamma radiation. As mentioned above, the level of the radiation 205 alone may not be sufficient to permanently destroy semiconductor chip 120. However, in accordance with embodiments of the invention, semiconductor package 110 is embedded with high-z oxide nanoparticles ($HfO_2$) 115 operative to enhance the level of radiation received by semiconductor chip 120. As mentioned, the high-z oxide nanoparticles 115 may comprise $HfO_2$.

Thus, as illustrated in FIG. 2, when semiconductor packaged assembly 100 receives radiation 205, the $HfO_2$ nanoparticles emit electron radiation 210. Note that rays of radiation are illustratively depicted in the figures by the arrows. The enhanced radiation provided by the addition of the electron radiation 210 emitted by the nanoparticles is sufficient to prevent operation of semiconductor chip 120 (i.e., prevent unauthorized use by permanently destroying the chip).

Semiconductor devices are affected by two basic radiation damage mechanisms: displacement damage and ionization damage. Displacement damage occurs when incident radiation displaces silicon atoms from their lattice sites. The resulting defects alter the electronic characteristics of the crystal. Ionization damage occurs when energy absorbed by electronic ionization in insulating layers, predominantly $SiO_2$, liberates charge carriers, which diffuse or drift to other locations where they are trapped, leading to unintended concentrations of charge and, as a consequence, parasitic fields. For MOSFETs, the most pronounced impact comes from ionization effects, as the key to their operation lies in the oxide that couples the gate to the channel. Positive charge buildup due to hole trapping in the oxide and at the interface shifts the gate voltage required for a given operating point to more negative values. This shift affects the operating points in analog circuitry and switching times in digital circuitry. Accordingly, the enhanced radiation provided by the addition of the electron radiation 210 emitted by the nanoparticles is sufficient to permanently destroy the semiconductor chip 120 through displacement damage and/or ionization damage.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method comprising:
   embedding high-z oxide nanoparticles in a semiconductor package of a semiconductor packaged assembly, wherein embedding the high-z oxide nanoparticles comprises forming a layer comprising the high-z oxide nanoparticles at least one of on and in the semiconductor package, and wherein forming the layer comprises suspending the high-z nanoparticles in a solvent, and depositing the suspended high-z nanoparticles via a deposition technique;
   wherein the high-z nanoparticles emit electron radiation when exposed to radiation emitted by a radiation source to render a semiconductor device in the semiconductor package inoperable.

2. The method of claim 1, wherein the high-z oxide nanoparticles comprise $HfO_2$.

3. The method of claim 1, wherein the semiconductor package comprises a polymer package.

4. The method of claim 1, wherein radiation from the radiation source comprises gamma radiation.

5. The method of claim 1, wherein the semiconductor device comprises a silicon-on-insulator substrate-based semiconductor device.

6. The method of claim 1, wherein the semiconductor device comprises a complementary metal oxide semiconductor device.

7. The method of claim 1, wherein the deposition technique is selected from the group consisting of: spin coating, spray coating and doctor blading.

8. The method of claim 1, wherein the solvent is selected from the group consisting of: aqueous material and organic material.

9. A method comprising:
   providing a semiconductor packaged assembly comprising a semiconductor device and a semiconductor package with embedded high-z oxide nanoparticles, wherein the semiconductor package comprises a layer comprising the high-z oxide nanoparticles at least one of on and in the semiconductor package formed by suspending the high-z nanoparticles in a solvent and depositing the suspended high-z nanoparticles via a deposition technique; and
   exposing the semiconductor package to a radiation source such that, in response to radiation emitted by the radiation source, the high-z nanoparticles emit electron radiation to render the semiconductor device in the semiconductor package inoperable.

10. The method of claim 9, wherein the high-z oxide nanoparticles comprise $HfO_2$.

11. The method of claim 9, wherein the semiconductor package comprises a polymer package.

12. The method of claim 9, wherein the radiation from the radiation source comprises gamma radiation.

13. The method of claim 9, wherein the semiconductor device comprises a silicon-on-insulator substrate-based semiconductor device.

14. The method of claim 9, wherein the semiconductor device comprises a complementary metal oxide semiconductor device.

15. An apparatus comprising:
   a semiconductor device; and
   a semiconductor package having the semiconductor device contained therein; and
   a layer formed at least one of on and in the semiconductor package by suspending high-z oxide nanoparticles in a solvent and depositing the suspended high-z oxide nanoparticles via a deposition technique; wherein the high-z nanoparticles emit electron radiation when exposed to radiation emitted by a radiation source to render the semiconductor device inoperable.

16. The apparatus of claim 15, wherein the high-z oxide nanoparticles comprise $HfO_2$.

17. The apparatus of claim 15, wherein the semiconductor package comprises a polymer package.

18. The apparatus of claim 15, wherein radiation from the radiation source comprises gamma radiation.

19. The apparatus of claim 15, wherein the semiconductor device comprises a silicon-on-insulator substrate-based semiconductor device.

20. The apparatus of claim 15, wherein the apparatus is implemented as part of an integrated circuit.

* * * * *